US010658218B2

(12) United States Patent
Tanaka et al.

(10) Patent No.: US 10,658,218 B2
(45) Date of Patent: May 19, 2020

(54) CUTTING METHOD OF WORKPIECE (71) Applicant: DISCO CORPORATION, Tokyo (JP)

(72) Inventors: Makoto Tanaka, Tokyo (JP); Masanari An, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/252,838

(22) Filed: Jan. 21, 2019

(65) Prior Publication Data
US 2019/0229005 A1    Jul. 25, 2019

(30) Foreign Application Priority Data

Jan. 23, 2018 (JP) .................................. 2018-008834

(51) Int. Cl.
*H01L 21/68* (2006.01)
*H01L 21/786* (2006.01)
*H01L 21/304* (2006.01)
*H01L 21/67* (2006.01)

(52) U.S. Cl.
CPC ........ *H01L 21/681* (2013.01); *H01L 21/3043* (2013.01); *H01L 21/67092* (2013.01); *H01L 21/786* (2013.01); *H01L 2223/5446* (2013.01)

(58) Field of Classification Search
None
See application file for complete search history.

(56) References Cited

U.S. PATENT DOCUMENTS

2009/0021476 A1* 1/2009 Steinle ................... G16H 40/63
345/156
2011/0141272 A1* 6/2011 Uto ..................... G01N 21/9501
348/135

FOREIGN PATENT DOCUMENTS

JP        2009021476 A    1/2009

\* cited by examiner

*Primary Examiner* — Zandra V Smith
*Assistant Examiner* — Andre C Stevenson
(74) *Attorney, Agent, or Firm* — Greer Burns & Crain Ltd.

(57) ABSTRACT

In a cutting method of a workpiece, a half-cut groove having a groove bottom that reflects light of an epi-illumination part is formed in a range of a peripheral surplus region of a planned dividing line that has not been cut, and the half-cut groove is detected with discrimination from a laser-processed groove that diffusely reflects the light and is darkly displayed.

2 Claims, 10 Drawing Sheets

CUTTING METHOD OF WORKPIECE

BACKGROUND OF THE INVENTION

Field of the Invention

The present invention relates to a cutting method of a workpiece.

Description of the Related Art

There is a semiconductor wafer having a functional layer for which a Low-k film is used as an interlayer insulating film on a surface of a silicon substrate for improvement in functions of semiconductor devices. In particular, the Low-k film is fragile and is readily separated from the silicon substrate. Therefore, in dicing processing by a conventional cutting blade, there is a possibility that the Low-k film is separated and semiconductor devices are broken. Therefore, a processing method by a laser beam and a cutting blade has been proposed in which a Low-k film is irradiated with the laser beam to form laser-processed grooves and the Low-k film is segregated in advance so as not to be separated and thereafter cutting is carried out by the cutting blade along this laser-processed groove to divide a semiconductor wafer (refer to Japanese Patent Laid-open No. 2009-021476, for example).

SUMMARY OF THE INVENTION

However, separation of the Low-k film occurs when a cut groove (breaking groove) is not formed at the position overlapping with the laser-processed groove by the cutting blade without protrusion of the cut groove from the laser-processed groove. Therefore, the position at which the cut groove is formed needs to be accurately controlled. For this reason, it is necessary to detect the positions of the laser-processed groove and the formed cut groove and recognize whether or not position deviation between the grooves exists. However, there is a problem that it is very difficult to detect the position of the cut groove overlapping with the laser-processed groove.

Thus, an object of the present invention is to provide a cutting method of a workpiece that can accurately detect a cut groove formed to overlap with a laser-processed groove.

In accordance with an aspect of the present invention, there is provided a cutting method of a workpiece that has, in a surface, a device region in which a device is formed in each of regions marked out by a plurality of planned dividing lines formed in a lattice manner and a peripheral surplus region that surrounds the device region, and in which laser-processed grooves are formed in the planned dividing lines by irradiation with a laser beam, by use of a cutting apparatus including a chuck table holding the workpiece by a holding surface, a cutting unit cutting the workpiece held by the chuck table by a cutting blade, a processing feed unit carrying out processing feed in an X-axis direction parallel to the holding surface of the chuck table, an indexing feed unit carrying out indexing feed of the cutting unit in a Y-axis direction that is parallel to the holding surface and is orthogonal to the X-axis direction, and a photographic unit including a camera that photographs the workpiece held by the chuck table and an epi-illumination part that emits light along an optical axis of the camera. The cutting method includes a half-cut groove forming step of forming a half-cut groove having a bottom that reflects the light of the epi-illumination part in a range of the peripheral surplus region of the planned dividing line that has not been cut, a detection step of photographing the half-cut groove by the photographic unit and detecting the half-cut groove with discrimination from the laser-processed groove that diffusely reflects the light of the epi-illumination part and is darkly displayed, a correction step of correcting deviation between the laser-processed groove and the half-cut groove, and a cutting step of positioning the cutting blade at the center of the laser-processed groove and carrying out cutting.

According to this configuration, the half-cut groove having the bottom that reflects the light of the epi-illumination part is formed in the range of the peripheral surplus region of the planned dividing line that has not been cut, and the half-cut groove is detected with discrimination from the laser-processed groove that diffusely reflects this light and is darkly displayed. Therefore, the position of the cut groove formed to overlap with the laser-processed groove can be accurately detected based on the difference in the brightness of the reflected light between the laser-processed groove and the half-cut groove by use of the difference in the shape of the groove bottom between the two grooves. Furthermore, the deviation between the laser-processed groove and the half-cut groove is corrected and the workpiece is cut with the cutting blade positioned at the center of the laser-processed groove. Thus, the workpiece can be accurately divided. Because the half-cut groove is formed in the range of the peripheral surplus region of the planned dividing line that has not been cut, damage to the devices in the device region can be prevented even when the half-cut groove involves position deviation with respect to the planned dividing line.

Preferably, the detection step includes a laser-processed groove detection sub-step of detecting the laser-processed groove darkly displayed with discrimination from the surface of the workpiece that reflects the light of the epi-illumination part and is brightly displayed and is on both sides of the laser-processed groove. According to this configuration, the boundaries between the laser-processed groove and the surface of the workpiece outside this laser-processed groove can be accurately detected based on the difference in the brightness between the reflected light reflected by the laser-processed groove and the reflected light reflected by the surface of the workpiece. For this reason, the amount of deviation between the center of the laser-processed groove and the center of the half-cut groove can be accurately detected.

According to the present invention, the half-cut groove having the bottom that reflects the light of the epi-illumination part is formed in the range of the peripheral surplus region of the planned dividing line that has not been cut, and the half-cut groove is detected with discrimination from the laser-processed groove that diffusely reflects the light of this epi-illumination illumination part and is darkly displayed. Therefore, the position of the cut groove formed to overlap with the laser-processed groove can be accurately detected based on the difference in the brightness of the reflected light between the laser-processed groove and the half-cut groove by use of the difference in the shape of the groove bottom between the two grooves.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
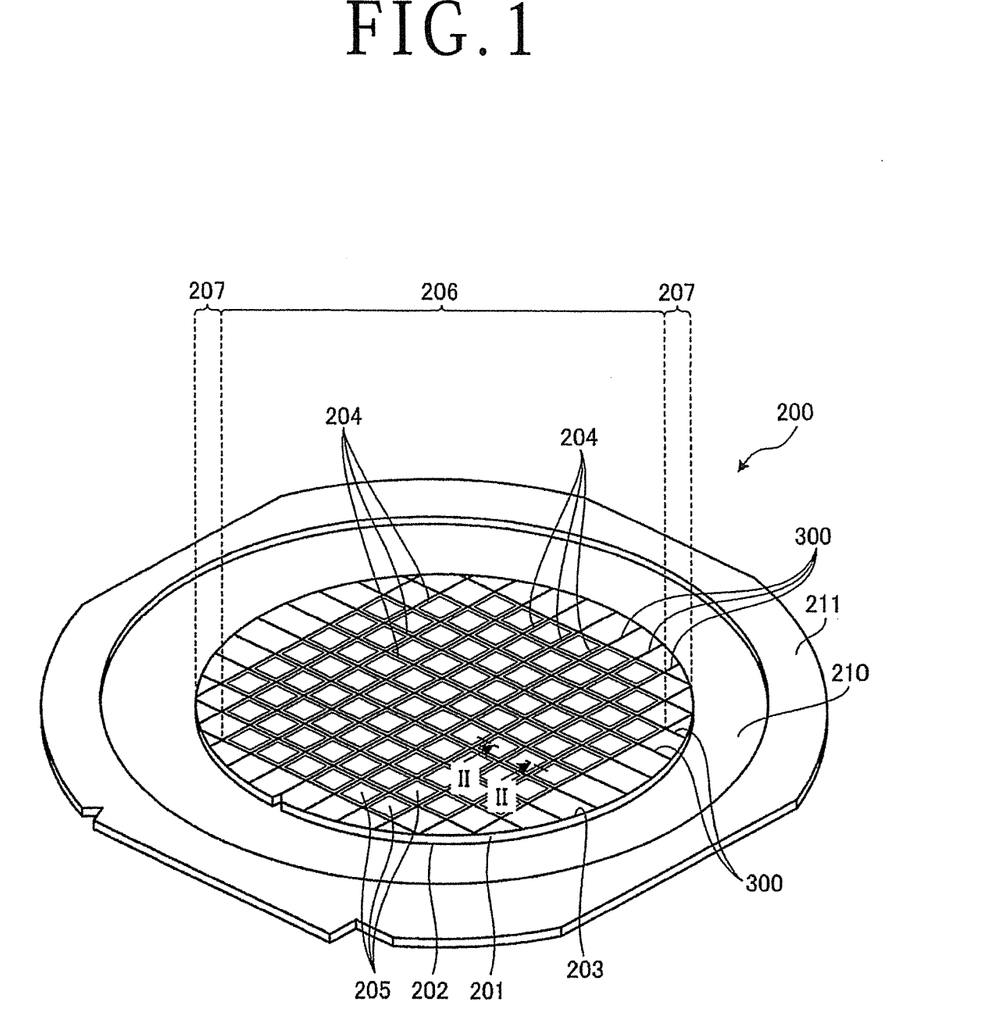
FIG. 1 is a perspective view of a workpiece that is a cutting target of a cutting method of a workpiece according to the present embodiment of the present invention.
Figure 2:
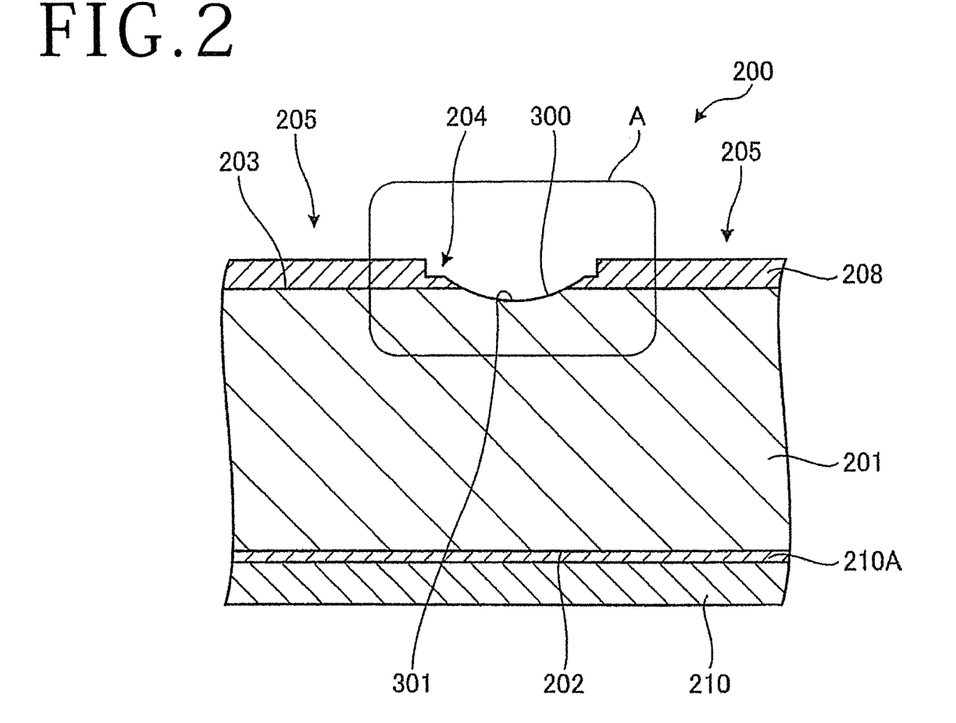
FIG. 2 is a sectional view along line II-II in FIG. 1.
Figure 3:
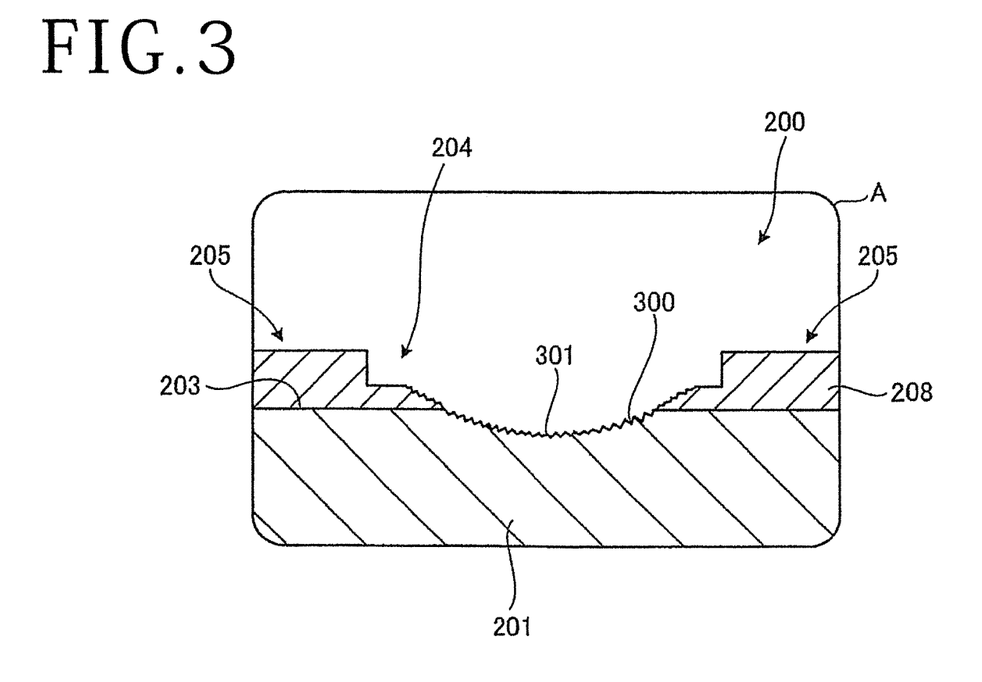
FIG. 3 is an enlarged diagram of part A in FIG. 2.
Figure 4:
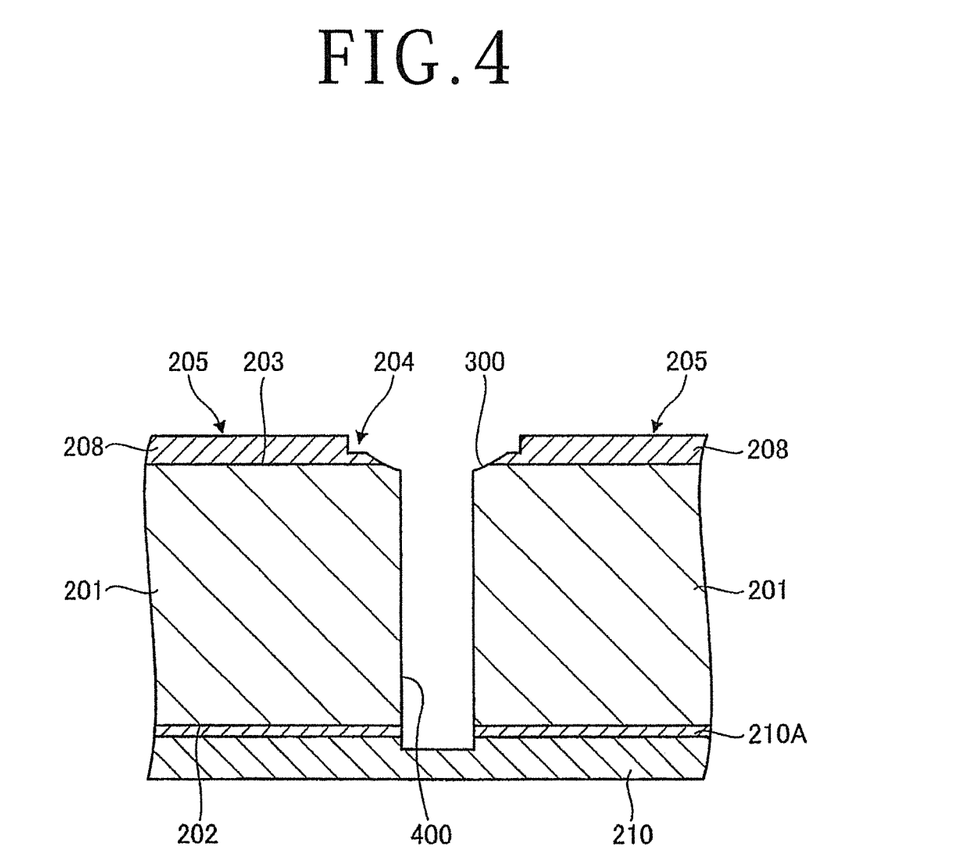
FIG. 4 is a sectional view of the workpiece in which a fully-cut groove is formed to overlap with a laser-processed groove.
Figure 5:
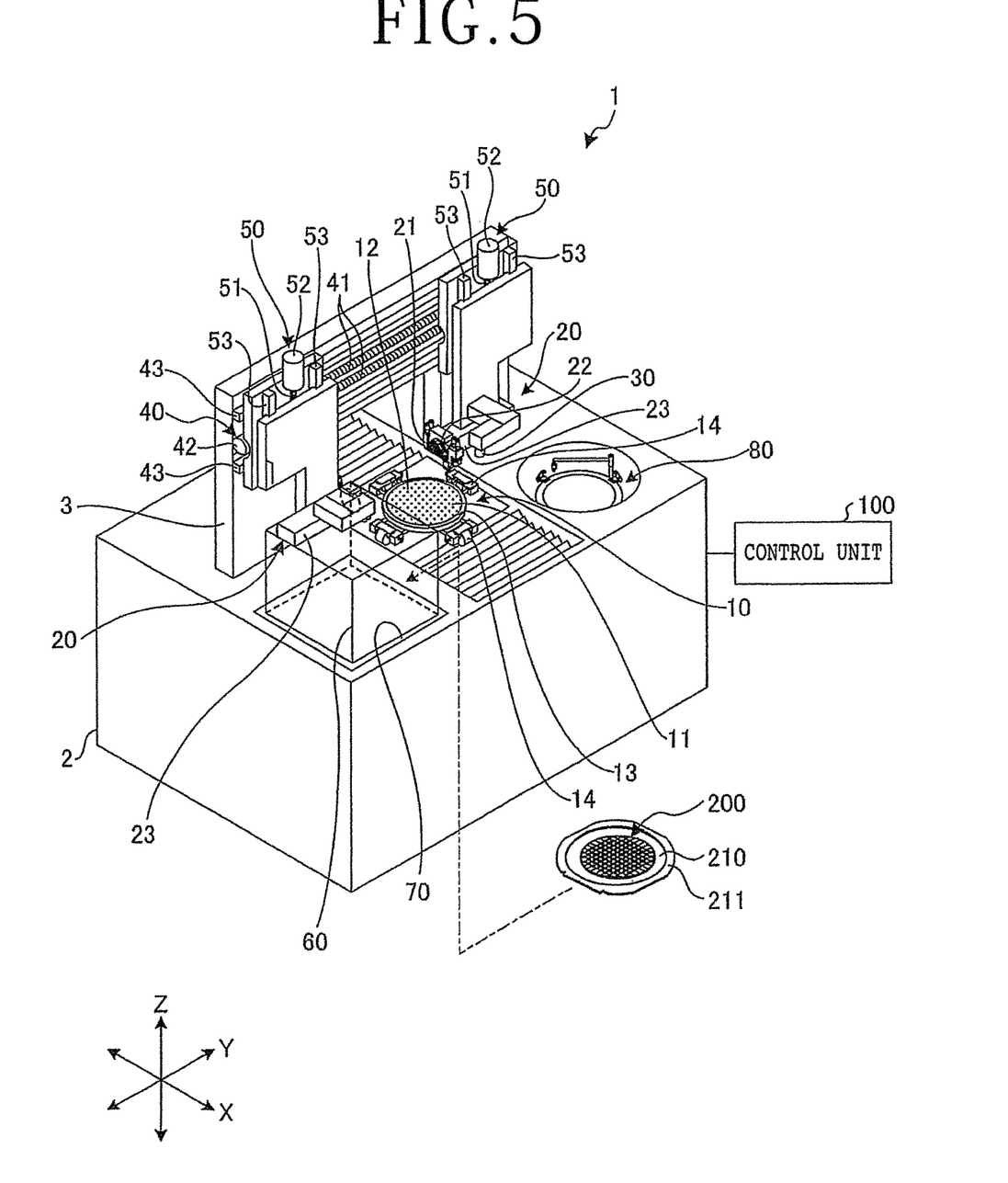
FIG. 5 is a perspective view illustrating a configuration example of a cutting apparatus used in the cutting method of a workpiece according to the present embodiment.
Figure 6:
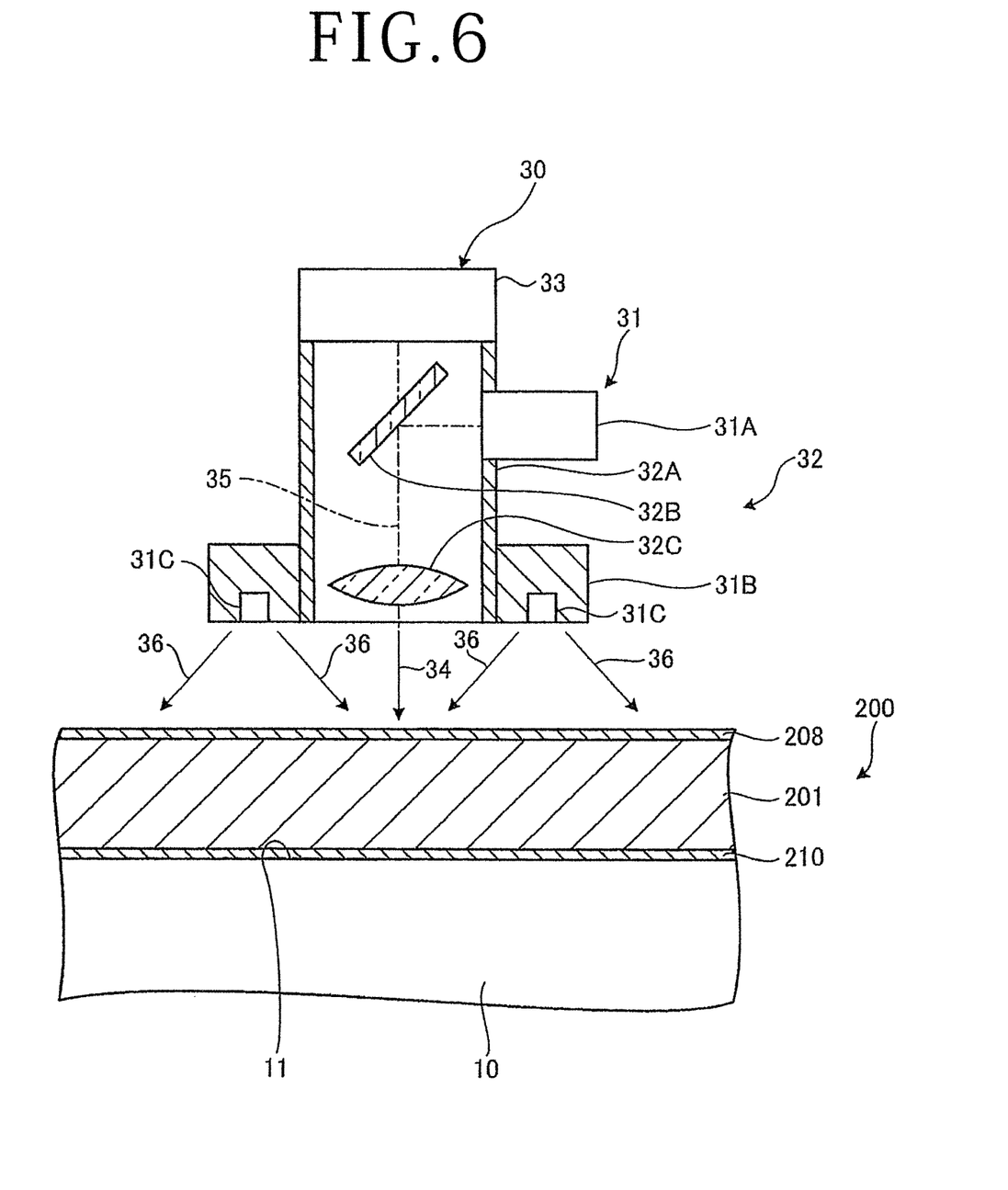
FIG. 6 is a sectional view illustrating a configuration of a photographic unit of the cutting apparatus illustrated in FIG. 5.

A cutting method of a workpiece according to the present embodiment of the present invention will be described based on the drawings. FIG. 1 is a perspective view of a workpiece that is a cutting target of the cutting method of a workpiece according to the present embodiment. FIG. 2 is a sectional view along line II-II in FIG. 1. FIG. 3 is an enlarged diagram of part A in FIG. 2. FIG. 4 is a sectional view of the workpiece in which a fully-cut groove is formed to overlap with a laser-processed groove. FIG. 5 is a perspective view illustrating a configuration example of a cutting apparatus used in the cutting method of a workpiece according to the present embodiment. FIG. 6 is a diagram illustrating a configuration of a photographic unit of the cutting apparatus illustrated in FIG. 5.

As illustrated in FIG. 1, a workpiece 200 according to the present embodiment is a circular-disc-shaped semiconductor wafer or optical device wafer including silicon, sapphire, gallium, or the like as a substrate 201. In the workpiece 200, a device 205 is formed in each of regions marked out in a lattice manner by plural planned dividing lines 204 formed over a front surface 203 of the substrate 201. Furthermore, the workpiece 200 includes a device region 206 in which these devices 205 are formed and a peripheral surplus region 207 that surrounds this device region 206 and in which the devices 205 are not formed. As illustrated in FIG. 2, a functional layer 208 formed by alternately stacking plural layers of low-dielectric-constant insulator coat (referred to also as Low-k film) and conductor film is stacked on the front surface 203 of the substrate 201 of the workpiece 200 and the devices 205 are formed in the functional layer 208. The functional layer 208 is disposed not only in the device region 206 but on the whole of the front surface 203 of the substrate 201 including the peripheral surplus region 207. The low-dielectric-constant insulator coat is formed of a film of an inorganic-based material such as SiOF or BSG (SiOB) or a film of an organic-based material that is a polymer film of a polyimide-based material, Parylene-based material, or the like.

In the present embodiment, for the workpiece 200, an adhesive tape 210 having an adhesive layer 210A is stuck to a back surface 202 and a ring-shaped frame 211 is stuck to a periphery of the adhesive tape 210. This integrates the workpiece 200 with the ring-shaped frame 211. The workpiece 200 is irradiated with a laser beam with such a wavelength as to be absorbed by the functional layer 208 and the substrate 201 along each planned dividing line 204 and a laser-processed groove 300 is formed at the central part of each planned dividing line 204 in the width direction as illustrated in FIG. 2 and FIG. 3. The laser-processed groove 300 splits the functional layer 208 at the planned dividing line 204 and reaches the front surface 203 of the substrate 201. As illustrated in FIG. 3, at a groove bottom 301 of the laser-processed groove 300, the material forming the substrate 201 and the functional layer 208 get altered and become an amorphous state and projections and recesses are formed. In the cutting method of the workpiece 200 according to the present embodiment, along the laser-processed groove 300 formed in the workpiece 200, as illustrated in FIG. 4, a fully-cut groove (cut groove) 400 having a depth equivalent to the thickness of the workpiece 200 is formed at a position overlapping with the laser-processed groove 300 to divide the workpiece 200 into the individual devices 205. It is preferable for the fully-cut groove 400 to be formed at the center of the groove bottom 301 of the laser-processed groove 300 in the width direction and the width of the fully-cut groove 400 is smaller than the width of the laser-processed groove 300.

As illustrated in FIG. 5, a cutting apparatus 1 includes a chuck table 10 that holds the workpiece 200 by suction by a holding surface 11, cutting units 20 that each cut the workpiece 200 held on the chuck table 10 by a cutting blade 22 mounted to a spindle 21, and photographic units 30 that are each a camera that photographs the workpiece 200 held by the chuck table 10.

Furthermore, the cutting apparatus 1 includes at least an X-axis movement unit (not illustrated) that carries out processing feed of the chuck table 10 in an X-axis direction parallel to the horizontal direction, Y-axis movement units 40 that each carry out indexing feed of the cutting unit 20 in a Y-axis direction that is parallel to the horizontal direction and is orthogonal to the X-axis direction, and Z-axis movement units 50 that each carry out processing-in feed of the cutting unit 20 in a Z-axis direction parallel to the vertical direction orthogonal to both the X-axis direction and the Y-axis direction. Moreover, the cutting apparatus 1 includes a control unit 100 that controls each of operations of these respective elements.

The chuck table 10 includes the holding surface 11 that holds the workpiece 200 and has a circular disc shape including a holding part 12 formed of porous ceramic or the like and a ring-shaped frame part 13 that surrounds the holding part 12. Furthermore, the chuck table 10 is disposed movably in the X-axis direction by the X-axis movement unit and rotatably around the axial center parallel to the Z-axis direction by a rotational drive source that is not illustrated in the diagram. The chuck table 10 is connected to a vacuum suction source that is not illustrated in the diagram and sucks and holds the workpiece 200 by being sucked by the vacuum suction source. Moreover, plural clamp parts 14 that clamp the ring-shaped frame 211 are disposed around the chuck table 10.

The cutting unit 20 includes the spindle 21 to which the cutting blade 22 that cuts the workpiece 200 held by the chuck table 10 is mounted. The cutting unit 20 is disposed movably in the Y-axis direction by the Y-axis movement unit 40 and movably in the Z-axis direction by the Z-axis movement unit 50 with respect to the workpiece 200 held by the chuck table 10. In the present embodiment, the cutting apparatus 1 is a cutting apparatus of a so-called facing dual-spindle type including the two cutting units 20 disposed opposed to each other in the Y-axis direction.

As illustrated in FIG. 5, the cutting units 20 are each disposed over a gate-shaped frame 3 set uptight from an apparatus main body 2 with the intermediary of the Y-axis movement unit 40, the Z-axis movement unit 50, and so forth. The cutting unit 20 allows the cutting blade 22 to be positioned at an arbitrary position in the holding surface 11 of the chuck table 10 by the Y-axis movement unit 40 and the Z-axis movement unit 50. The cutting blade 22 is an extremely-thin cutting abrasive having a substantially ring shape. The spindle 21 rotates the cutting blade 22 to cut the workpiece 200. The spindle 21 is rotatably housed in a spindle housing 23 and the spindle housing 23 is supported by the Z-axis movement unit 50. The axial center of the spindle 21 and the cutting blade 22 of the cutting unit 20 is set in parallel to the Y-axis direction. While indexing feed of the cutting unit 20 is carried out in the Y-axis direction by the Y-axis movement unit 40 and processing-in feed of the cutting unit 20 is carried out by the Z-axis movement unit 50, cutting feed of the chuck table 10 is carried out in the X-axis direction by the X-axis movement unit. Thereby, the cutting unit 20 cuts the workpiece 200.

The X-axis movement unit is processing feed means that carries out processing feed of the chuck table 10 in the X-axis direction by moving the chuck table 10 in the X-axis direction. The Y-axis movement unit 40 is indexing feed means that carries out indexing feed of the cutting unit 20 by moving the cutting unit 20 in the Y-axis direction. The Z-axis movement unit 50 is what carries out processing-in feed of the cutting unit 20 by moving the cutting unit 20 in the Z-axis direction. The X-axis movement unit, the Y-axis movement units 40, and the Z-axis movement units 50 include well-known ball screws 41 and 51 disposed rotatably around the axial center, well-known pulse motors 42 and 52 that rotate the ball screws 41 and 51 around the axial center, and well-known guide rails 43 and 53 that support the chuck table 10 or the cutting unit 20 movably in the X-axis direction, the Y-axis direction, or the Z-axis direction.

Furthermore, the cutting apparatus 1 includes a cassette elevator 70 on which a cassette 60 that houses the workpiece 200 before and after cutting is placed and that moves the cassette 60 in the Z-axis direction, a cleaning unit 80 that cleans the workpiece 200 after cutting, and a conveying unit that conveys the workpiece 200 among the cassette 60, the chuck table 10, and the cleaning unit 80 and is not illustrated in the diagram.

The photographic unit 30 is fixed to the spindle housing 23 of the cutting unit 20 so as to move integrally with the cutting unit 20. The photographic unit 30 photographs the surface of the workpiece 200 held by the chuck table 10. As illustrated in FIG. 6, the photographic unit 30 includes an illuminator 31, an optical system 32, and a charge coupled device (CCD) photographic element 33 that is a camera that photographs the surface of the workpiece 200 held by the chuck table 10.

The illuminator 31 is formed of a halogen light source or a light emitting diode (LED), for example, and includes an epi-illumination (referred to also as coaxial illumination) part 31A whose light amount is adjusted by the control unit 100. The epi-illumination part 31A emits light toward the optical system 32. The optical system 32 includes a case 32A, a half mirror 32B that is disposed on the upper side of the case 32A and specularly reflects the light emitted by the epi-illumination part 31A toward the workpiece 200 held by the chuck table 10 in parallel to the Z-axis direction (FIG. 5), and a collecting lens 32C that is disposed in the case 32A and is disposed on the lower side of the half mirror 32B. The epi-illumination part 31A illuminates the workpiece 200 with light (incident light) 34 parallel to the Z-axis direction (FIG. 5) through the half mirror 32B and the collecting lens 32C.

The CCD photographic element 33 is disposed above the half mirror 32B. The CCD photographic element 33 outputs, to the control unit 100, an image obtained by receiving light that has been reflected by the workpiece 200 and passed through the collecting lens 32C and the half mirror 32B. For example, the CCD photographic element 33 obtains an image for implementing alignment to carry out position adjustment between the workpiece 200 and the cutting blade 22. Furthermore, the CCD photographic element 33 obtains an image for detecting whether or not position deviation exists between the laser-processed groove 300 formed in the workpiece 200 and a half-cut groove (described later) formed at a position overlapping with this laser-processed groove 300.

The light 34 that is emitted by the epi-illumination part 31A and is specularly reflected by the half mirror 32B is parallel to an optical axis 35 of the collecting lens 32C and the CCD photographic element 33. Furthermore, the illuminator 31 includes an oblique light illumination part 31B at the outer circumference of the lower end part of the case 32A. This oblique light illumination part 31B includes plural light emitting elements 31C disposed at intervals in the circumferential direction around the collecting lens 32C and irradiates the workpiece 200 with light (oblique light) 36. The control unit 100 carries out illumination for the workpiece 200 by one of the epi-illumination part 31A or the oblique light illumination part 31B or by combining both. In the case of using the epi-illumination part 31A and the oblique light illumination part 31B in combination, the control unit 100 adjusts each of the light amounts of the epi-illumination part 31A and the oblique light illumination part 31B.

The control unit 100 controls each of the above-described described constituent elements of the cutting apparatus 1 and causes the cutting apparatus 1 to carry out processing operation for the workpiece 200. The control unit 100 is a computer. The control unit 100 has an arithmetic processing apparatus having a microprocessor such as a central processing unit (CPU), a storing apparatus having a memory such as a read only memory (ROM) or random access memory (RAM), and an input-output interface apparatus. The arithmetic processing apparatus of the control unit 100 executes arithmetic processing in accordance with a computer program stored in the storing apparatus and outputs control signals for controlling the cutting apparatus 1 to the above-described constituent elements of the cutting apparatus 1 through the input-output interface apparatus. Furthermore, the control unit 100 is connected to a display unit that is formed of a liquid crystal display apparatus or the like that displays the state of processing operation, images, and so forth and is not illustrated in the diagram and an input unit that is used when an operator registers information on the content of processing and so forth and is not illustrated in the diagram. The input unit includes at least one of a touch panel installed in the display unit and an external input apparatus such as a keyboard. The control unit 100 outputs an image obtained through photographing by the CCD photographic element 33 of the photographic unit 30 to the display unit and causes the display unit to display the image.

Figure 7:
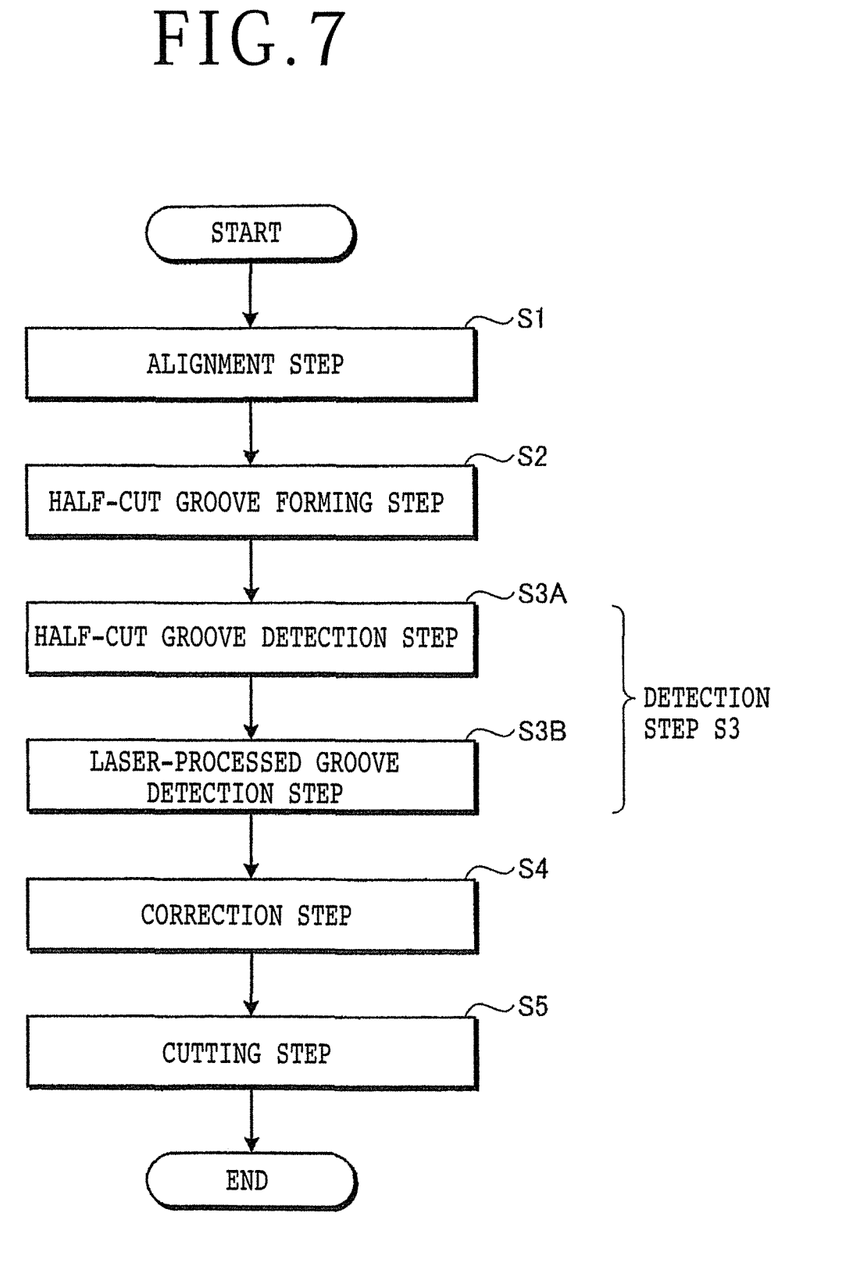
FIG. 7 is a flowchart illustrating a procedure of the cutting method of a workpiece.
Figure 8:
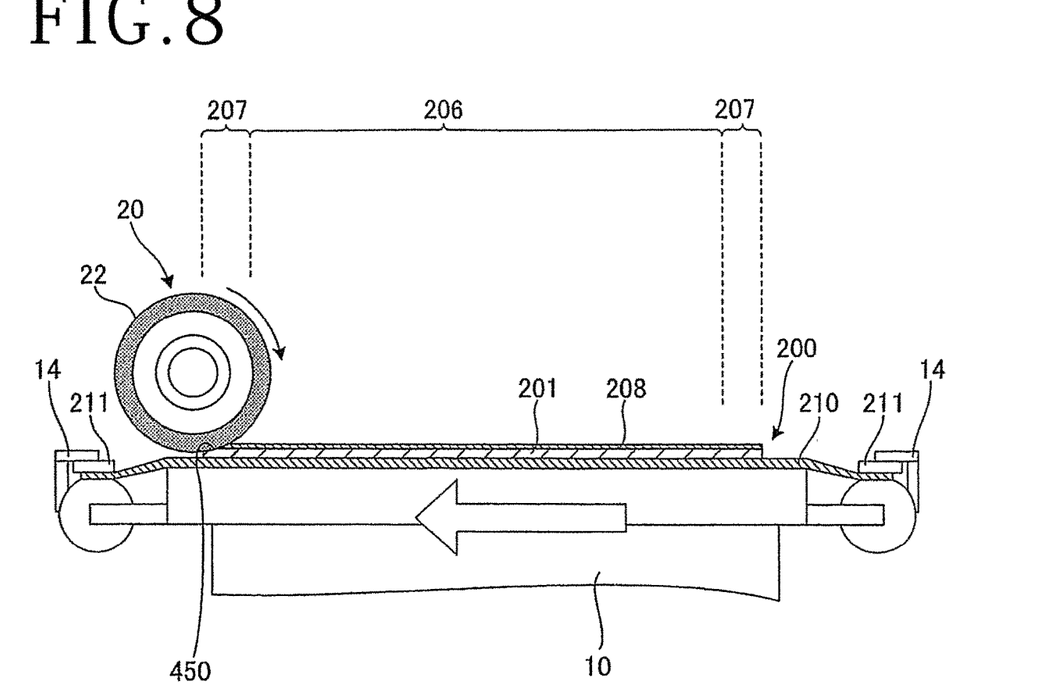
FIG. 8 is a sectional view illustrating one example of a half-cut groove forming step in FIG. 7.
Figure 9:
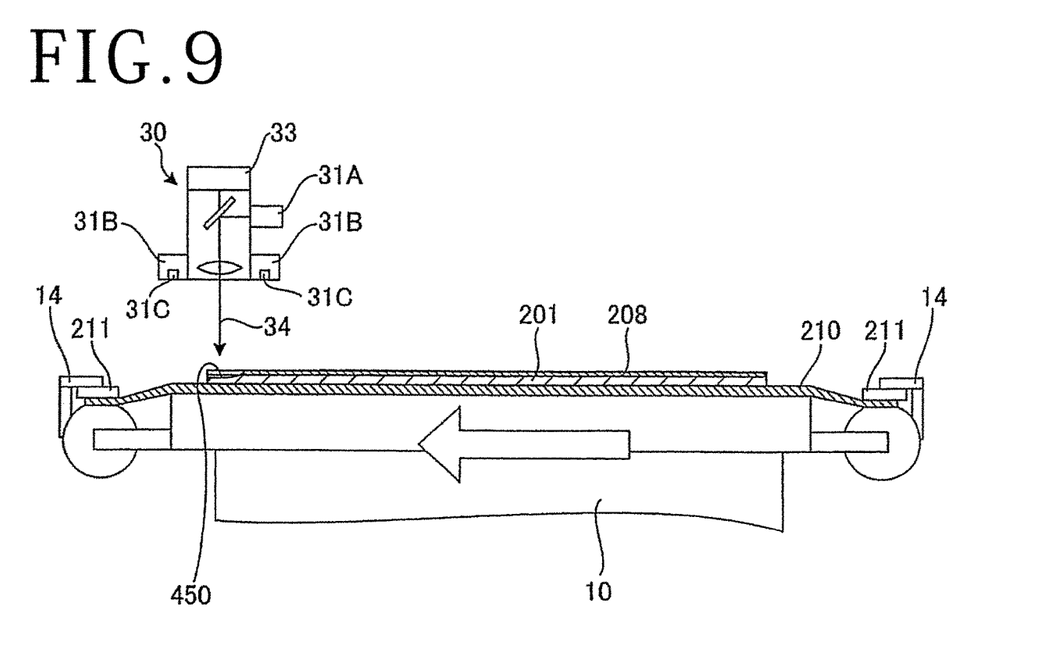
FIG. 9 is a sectional view illustrating a positional relation between a chuck table and the photographic unit at a time of a half-cut groove detection step in FIG. 7.
Figure 10:
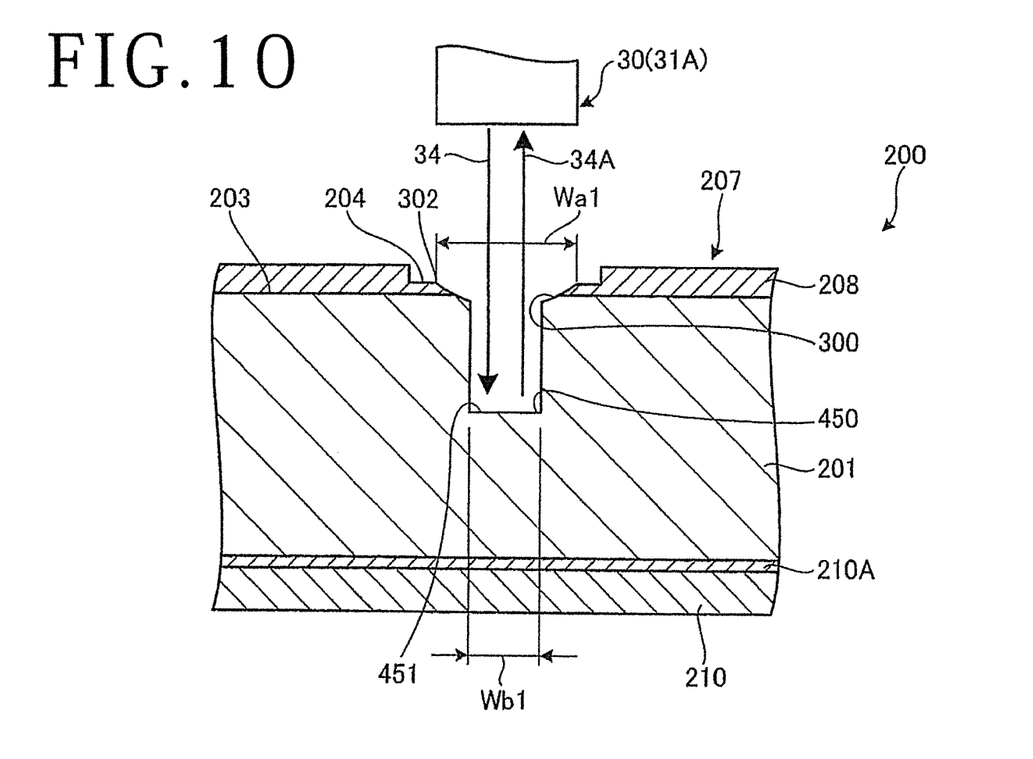
FIG. 10 is a sectional view of the workpiece illustrating a half-cut groove formed under a groove bottom of the laser-processed groove in the half-cut groove detection step in FIG. 7.
Figure 11:
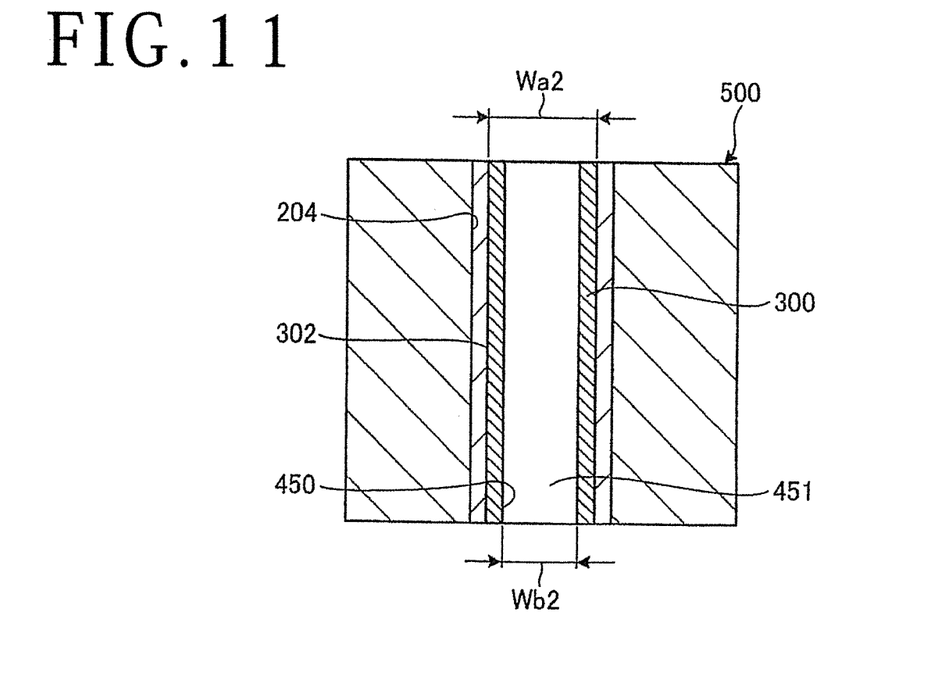
FIG. 11 is a diagram illustrating one example of a photographed image photographed by the photographic unit in the half-cut groove detection step in FIG. 7.
Figure 12:
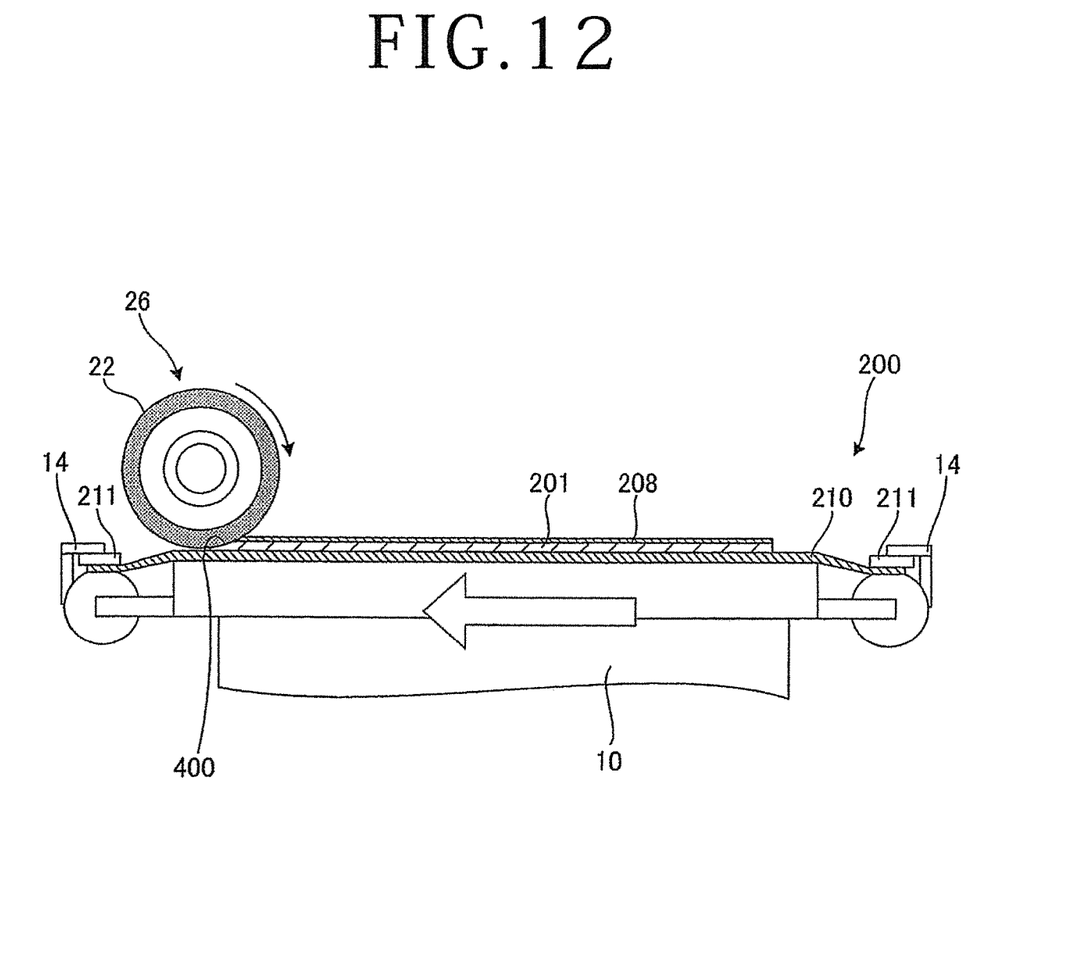
FIG. 12 is a sectional view illustrating one example of a cutting step in FIG. 7.

Next, the cutting method of the workpiece 200 according to the present embodiment will be described. FIG. 7 is a flowchart illustrating a procedure of the cutting method of the workpiece. FIG. 8 is a schematic diagram of the chuck table and the cutting blade illustrating one example of a half-cut groove forming step in FIG. 7. FIG. 9 is a schematic diagram of the chuck table and the photographic unit illustrating one example of a half-cut groove detection step in FIG. 7. FIG. 10 is a sectional view of the workpiece illustrating a half-cut groove formed under the groove bottom of the laser-processed groove in the half-cut groove detection step in FIG. 7. FIG. 11 is a diagram illustrating one example of a photographed image photographed by the photographic unit in the half-cut groove detection step in FIG. 7. FIG. 12 is a schematic diagram of the chuck table and the cutting blade illustrating one example of a cutting step in FIG. 7.

(Alignment Step S1)

First, the workpiece 200 is held on the chuck table 10 and alignment to carry out position adjustment between this workpiece 200 and the cutting blade 22 of the cutting unit 20 is implemented (step S1). Specifically, the control unit 100 moves the chuck table 10 toward the lower side of the cutting unit 20 by the X-axis movement unit and positions the workpiece 200 held by the chuck table 10 below the photographic unit 30 and causes the photographic unit 30 to photograph the workpiece 200. The control unit 100 executes image processing such as pattern matching in which a specific pattern set in the pattern of the device 205 is employed as a key pattern, for carrying out position adjustment between the planned dividing line 204 of the workpiece 200 held by the chuck table 10 and e.g. the cutting blade 22 of the cutting unit 20, and implements alignment to adjust the relative position between the workpiece 200 held by the chuck table 10 and the cutting unit 20. Here, in the workpiece 200 held by the chuck table 10, the laser-processed grooves 300 (FIG. 2) are formed along the planned dividing lines 204 in advance.

(Half-cut Groove Forming Step S2)

Next, before cutting of the workpiece 200 for which the alignment has been implemented, a half-cut groove for check is formed to overlap with the laser-processed groove 300 formed in the planned dividing line 204 in the peripheral surplus region 207 of the workpiece 200 (step S2). The control unit 100 adjusts the height of the cutting blade 22 of the cutting unit 20 by the Z-axis movement unit 50. In addition, by the X-axis movement unit and the rotational drive source, as illustrated in FIG. 8, the control unit 100 relatively moves the cutting blade 22 of the cutting unit 20 and the workpiece 200 along the planned dividing line 204 (FIG. 2) and forms a half-cut groove 450 by the cutting blade 22 while supplying cutting water.

As illustrated in FIG. 10, the half-cut groove 450 is a groove formed at a position overlapping with the laser-processed groove 300. For example, the half-cut groove 450 is formed to a depth equivalent to about half the thickness of the substrate 201 from the side of the front surface 203 of the substrate 201 and the depth is set to a depth sufficiently reached by the incident light. This half-cut groove 450 is formed by cutting by the cutting blade 22. The cutting blade 22 is a so-called abrasive stone and the bottom surface (front surface) of the half-cut groove 450 (cut groove) becomes a state like a polished state. Thus, the half-cut groove 450 is flatter compared with the laser-processed groove 300 and has a groove bottom 451 that specularly reflects the light 34 from the epi-illumination part 31A. The half-cut groove 450 is a groove for checking relative position deviation of the cutting blade 22 in the Y-axis direction with respect to the laser-processed groove 300. For this reason, it suffices for the half-cut groove 450 to be formed in at least one laser-processed groove 300 (planned dividing line 204) extending in the range of the peripheral surplus region 207 of the workpiece 200. The half-cut groove 450 is formed with the same width as the fully-cut groove 400 (FIG. 4) by the same cutting blade 22 as the fully-cut groove 400 formed when the workpiece 200 is cut along the planned dividing line 204.

(Half-cut Groove Detection Step S3A; Detection Step S3)

Next, the half-cut groove 450 is photographed by the photographic unit 30 and the half-cut groove 450 that overlaps with the laser-processed groove 300 is detected (step S3A). As illustrated in FIG. 9, the control unit 100 turns on the epi-illumination part 31A included in the photographic unit 30 and turns off the oblique light illumination part 31B. Then, the control unit 100 moves the chuck table 10 to the lower side of the photographic unit 30 and positions the half-cut groove 450 of the workpiece 200 to the lower side of the photographic unit 30 by the X-axis movement unit and the Y-axis movement unit 40, and causes the photographic unit 30 to photograph a peripheral part including the half-cut groove 450. In this case, as illustrated in FIG. 10, the groove bottom 451 of the half-cut groove 450 formed in the workpiece 200 specularly reflects the light 34 from the epi-illumination part 31A and reflected light 34A resulting from the reflection directly returns to the photographic unit 30. In contrast, because fine projections and recesses are formed in the laser-processed groove 300, part of the applied light returns to the photographic unit 30 due to diffuse reflection of the light from the epi-illumination part 31A. For this reason, in a photographed image 500 photographed by the photographic unit 30, as illustrated in FIG. 11, the laser-processed groove 300 is displayed relatively darkly and the half-cut groove 450 is displayed relatively brightly. The control unit 100 detects the parts in which the light amount is smaller than a predetermined threshold (illustrated by dense parallel oblique lines in FIG. 11) in the photographed image 500 photographed by the photographic unit 30 as the laser-processed groove 300, and detects the part in which the light amount is equal to or larger than the predetermined threshold between the parts detected as the laser-processed groove 300 (illustrated by a white region in FIG. 11) in the photographed image 500 as the half-cut groove 450. In the present embodiment, because the half-cut groove 450 is displayed relatively brightly, confusion between the half-cut groove 450 and the laser-processed groove 300 is suppressed and the half-cut groove 450 with a width Wb2 (FIG. 11) equivalent to a width Wb1 (FIG. 10) of the actual half-cut groove 450 can be accurately detected with discrimination from the laser-processed groove 300.

(Laser-processed Groove Detection Step S3B; Detection Step S3)

Next, the boundaries between the laser-processed groove 300 and the surface of the workpiece 200 located on both outsides (both sides) of this laser-processed groove 300 are detected (step S3B). The surface of the workpiece 200 (including the surface of the planned dividing line 204) specularly reflects the light 34 from the epi-illumination part 31A similarly to the groove bottom 451 of the half-cut groove 450, and the reflected light 34A resulting from the reflection directly returns to the photographic unit 30. Thus, the surface of the workpiece 200 is displayed brightly relative to the laser-processed groove 300. The control unit 100 detects the part in which the light amount is smaller than a predetermined threshold (illustrated by the dense parallel oblique lines in FIG. 11) in the photographed image 500 photographed by the photographic unit 30 as the laser-processed groove 300, and detects the parts in which the light amount is equal to or larger than the predetermined threshold on both sides of the laser-processed groove 300 (illustrated by sparse parallel oblique lines in FIG. 11) in the photographed image 500 as the surface of the workpiece 200. The control unit 100 detects boundaries 302 between the laser-processed groove 300 and the surface of the workpiece 200. As the predetermined threshold for discriminating the laser-processed groove 300 and the surface of the workpiece 200, the same value as the threshold for discriminating the laser-processed groove 300 and the half-cut groove 450 may be used. Alternatively, the threshold may be changed depending on difference in the light amount between the reflected light from the surface of the workpiece 200 and the reflected light from the half-cut groove 450. In the present embodiment, because the boundaries 302 between the laser-processed groove 300 and the surface of the workpiece 200 are detected, the laser-processed groove 300 with a width Wa2 (FIG. 11) equivalent to a width Wa1 (FIG. 10) of the actual laser-processed groove 300 can be accurately detected.

In the present embodiment, a detection step S3 includes the half-cut groove detection step S3A and the laser-processed groove detection step S3B. The order of the half-cut groove detection step S3A and the laser-processed groove detection step S3B may be reversed or these steps may be simultaneously carried out.

(Correction Step S4)

Next, deviation of the position of the half-cut groove 450 relative to the laser-processed groove 300 is detected and this deviation is corrected (step S4). The control unit 100 calculates the position of the center of the laser-processed groove 300 in the width direction and the position of the center of the half-cut groove 450 in the width direction and calculates the amount of deviation between the laser-processed groove 300 and the half-cut groove 450 in the Y-axis direction. Then, the control unit 100 controls the Y-axis movement unit 40 to correct the position of the cutting blade 22 of the cutting unit 20 in such a manner that the calculated amount of deviation in the Y-axis direction becomes zero.

In the present embodiment, the width Wa2 of the laser-processed groove 300 and the width Wb2 of the half-cut groove 450 can be accurately detected. Therefore, the position of the center of each groove in the width direction can be accurately calculated and thus the amount of deviation between the respective grooves in the Y-axis direction can be accurately calculated. For this reason, by correcting the position of the cutting blade 22 based on the amount of deviation accurately calculated, the cutting blade 22 can be accurately positioned at the center of the laser-processed groove 300 in the width direction. In the present embodiment, a kerf check step includes the above-described half-cut groove forming step S2, detection step S3, and correction step S4.

(Cutting Step S5)

Next, the workpiece 200 is cut along the laser-processed grooves 300 (planned dividing lines 204) in the state in which the cutting blade 22 is positioned at the center of the laser-processed groove 300 in the width direction (step S5). The control unit 100 adjusts the height of the cutting blade 22 of the cutting unit 20 by the Z-axis movement unit 50. In addition, by the X-axis movement unit and the rotational drive source, as illustrated in FIG. 12, the control unit 100 relatively moves the cutting blade 22 of the cutting unit 20 and the workpiece 200 along the planned dividing line 204 (FIG. 2) and forms the fully-cut groove (cut groove) 400 by the cutting blade 22 while supplying cutting water to cut the workpiece 200. After the cutting along one planned dividing line 204 ends, the control unit 100 controls the Y-axis movement unit 40 to carry out indexing feed in the Y-axis direction by an amount equivalent to a predetermined pitch (pitch between the central positions of the planned dividing lines 204 in the width direction) and carries out cutting along the next planned dividing line 204. Here, the control unit 100 may implement a known kerf check at a predetermined timing in execution of the cutting step S5. The timing when this known kerf check is implemented is the timing when the fully-cut grooves (cut grooves) 400 have been formed for every predetermined number (five or ten, for example) of planned dividing lines 204 defined in advance. However, the timing is not limited thereto. The control unit 100 ends the processing when cutting all planned dividing lines 204 and dividing the workpiece 200 into the individual devices 205.

In the cutting method of the workpiece 200 according to the present embodiment, the half-cut groove 450 having the groove bottom 451 that reflects the light 34 of the epi-illumination part 31A is formed in the range of the peripheral surplus region 207 of the planned dividing line 204 that has not been cut, and the half-cut groove 450 is detected with discrimination from the laser-processed groove 300, which diffusely reflects the light 34 and is darkly displayed. Therefore, by using the difference in the shape between the groove bottom 301 of the laser-processed groove 300 and the groove bottom 451 of the half-cut groove 450, the position of the half-cut groove 450 as the cut groove formed to overlap with the laser-processed groove 300 can be accurately detected based on the difference in the brightness of the reflected light between the laser-processed groove 300 and the half-cut groove 450. Furthermore, deviation between the laser-processed groove 300 and the half-cut groove 450 is corrected and the workpiece 200 is cut with the cutting blade 22 positioned at the center of the laser-processed groove 300 in the width direction. Thus, the workpiece 200 can be accurately divided into the individual devices 205. For this reason, as in the present embodiment, even with the workpiece 200 that includes the functional layer 208 on a surface of the substrate 201 and in which the laser-processed grooves 300 are formed in advance in order to prevent this functional layer 208 from being separated, separation of the functional layer 208 can be suppressed and damage to the devices 205 in the device region 206 can be prevented because the workpiece 200 can be cut with the cutting blade 22 positioned at the center of ht laser-processed groove 300 in the width direction.

Furthermore, the half-cut groove 450 is formed in the range of the peripheral surplus region 207 of the planned dividing line 204 that has not been cut. Therefore, even when the half-cut groove 450 involves position deviation with respect to the planned dividing line 204 or the laser-processed groove 300, damage to the devices 205 in the device region 206 can be prevented by correcting this position deviation and carrying out cutting.

Furthermore, according to the present embodiment, the detection step S3 includes the laser-processed groove detection step S3B in which the laser-processed groove 300 darkly displayed is detected with discrimination from the surface of the workpiece 200 on both sides of the laser-processed groove 300, which reflects the epi-illumination part 31A and is brightly displayed.

Therefore, the boundaries 302 between the laser-processed groove 300 and the surface of the workpiece 200 outside the laser-processed groove 300 can be accurately detected based on the difference in the brightness between the reflected light reflected by the laser-processed groove 300 and the reflected light reflected by the surface of the workpiece 200. For this reason, the amount of deviation between the center of the laser-processed groove 300 in the width direction and the center of the half-cut groove 450 in the width direction can be accurately detected.

Figure 13:
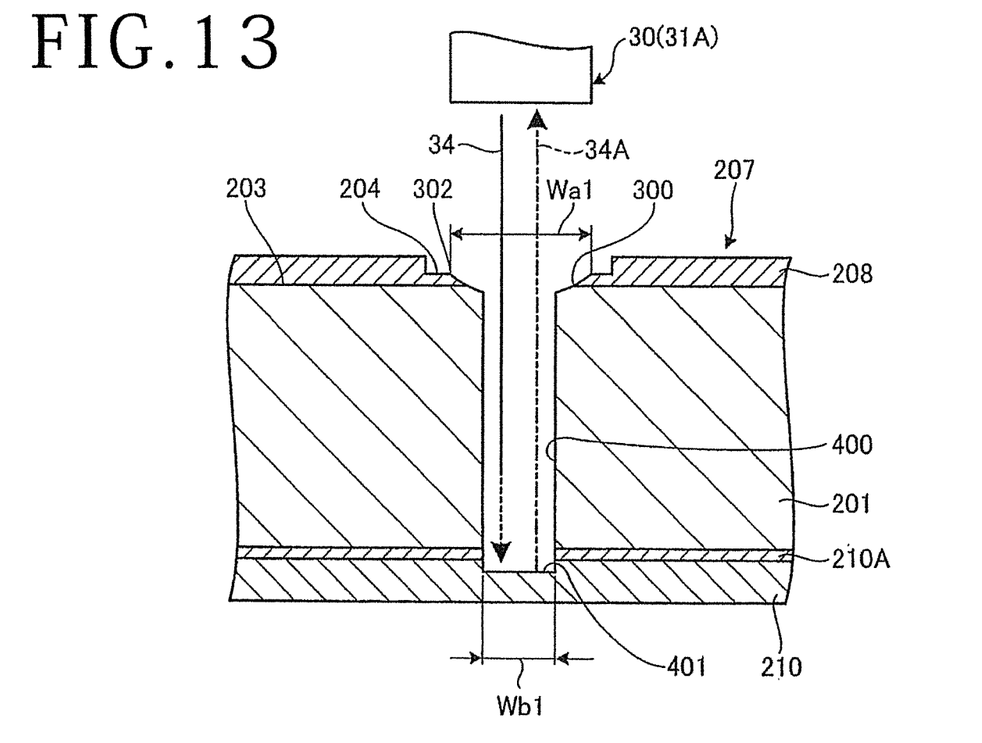
FIG. 13 is a sectional view of the workpiece illustrating a fully-cut groove formed under a groove bottom of a laser-processed groove in a groove detection step of a reference example.
Figure 14:
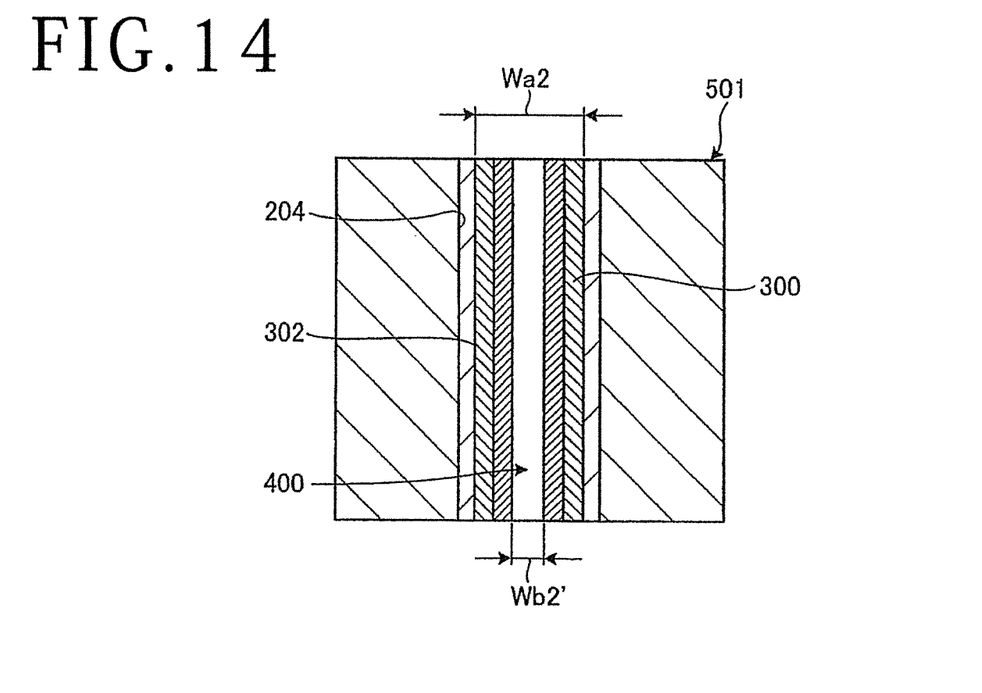
FIG. 14 is a diagram illustrating one example of a photographed image photographed by a photographic unit in the groove detection step of the reference example.

Incidentally, in the present embodiment, the half-cut groove 450 is formed as a cut groove at a position overlapping with the laser-processed groove 300 and the position of the half-cut groove 450 relative to the laser-processed groove 300 is accurately detected based on the photographed image 500. Here, a method is envisaged in which the fully-cut groove (FIG. 4) 400 is formed at a position overlapping with the laser-processed groove 300 instead of the half-cut groove 450 and the position of the fully-cut groove 400 relative to the laser-processed groove 300 is detected. As a reference example, the inventor formed the fully-cut groove 400 at a position overlapping with the laser-processed groove 300 and detected the position of the fully-cut groove 400 relative to the laser-processed groove 300. FIG. 13 is a sectional view of the workpiece illustrating the fully-cut groove formed under the groove bottom of the laser-processed groove in the reference example. FIG. 14 is a diagram illustrating one example of a photographed image photographed by the photographic unit in the reference example. In this reference example, the position of the fully-cut groove 400 was detected under the same condition as the above-described embodiment. Therefore, the same configuration as the above-described embodiment is given the same symbol.

Specifically, in the range of the peripheral surplus region 207 of the workpiece 200, the fully-cut groove 400 was formed to overlap with the laser-processed groove 300 formed in the planned dividing line 204. This fully-cut groove 400 extends from the laser-processed groove 300 to the adhesive tape 210 in the thickness direction of the substrate 201. A groove bottom 401 of the fully-cut groove 400 partly cuts the adhesive tape 210 and is formed in the adhesive tape 210. Although the fully-cut groove 400 was formed in the range of the peripheral surplus region 207 in the reference example, the fully-cut groove 400 may be formed in the range in which the workpiece 200 is divided along the planned dividing lines 204.

The photographic unit 30 is positioned above this fully-cut groove 400 and the epi-illumination part 31A is turned on and the oblique light illumination part 31B is turned off. The photographic unit 30 is caused to photograph a peripheral part including the fully-cut groove 400. In this case, the groove bottom 401 of the fully-cut groove 400 formed in the workpiece 200 is located on the adhesive tape 210. When the adhesive tape 210 is cut by the cutting blade 22, the cut surface becomes uneven compared with the substrate 201 of silicon or the like. For this reason, as illustrated in FIG. 13, the light 34 from the epi-illumination part 31A is diffusely reflected by the groove bottom 401 of the fully-cut groove 400 and part of the applied light 34 returns to the photographic unit 30 as the reflected light 34A. Furthermore, as described above, the laser-processed groove 300 also diffusely reflects the light from the epi-illumination part 31A. Due to this, only part of the applied light returns to the photographic unit 30. For this reason, in a photographed image 501 photographed by the photographic unit 30, as illustrated in FIG. 14, the laser-processed groove 300 and the fully-cut groove 400 are displayed relatively darkly and the light amounts of both are smaller than a predetermined threshold. Due to this, it is difficult to detect the position of the fully-cut groove 400. In particular, in the fully-cut groove 400, the part close to the wall surface adjacent to the laser-processed groove 300 becomes dark. Therefore, a width Wb2' (FIG. 14) of the detected fully-cut groove 400 is smaller than the width Wb1 (FIG. 13) of the actual fully-cut groove 400. Thus, it has turned out that, if the fully-cut groove 400 is formed instead of the half-cut groove 450, the light 34 emitted from the epi-illumination part 31A is diffusely reflected by the groove bottoms of both the laser-processed groove 300 and the fully-cut groove 400 and it is impossible to accurately detect the fully-cut groove 400.

The present invention is not limited to the above-described embodiment. That is, the present invention can be carried out with various modifications without departing from the gist of the present invention. For example, although the configuration in which the functional layer 208 is stacked on a surface of a substrate is employed as the workpiece in the present embodiment, the present invention can be used also for cutting of a workpiece in which a functional layer is not stacked.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting method of a workpiece that has, in a surface, a device region in which a device is formed in each of regions marked out by a plurality of planned dividing lines formed in a lattice manner and a peripheral surplus region that surrounds the device region, and in which laser-processed grooves are formed in the planned dividing lines by irradiation with a laser beam, by use of a cutting apparatus including a chuck table holding the workpiece by a holding surface, a cutting unit cutting the workpiece held by the chuck table by a cutting blade, a processing feed unit carrying out processing feed in an X-axis direction parallel to the holding surface of the chuck table, an indexing feed unit carrying out indexing feed of the cutting unit in a Y-axis direction that is parallel to the holding surface and is orthogonal to the X-axis direction, and a photographic unit including a camera that photographs the workpiece held by the chuck table and an epi-illumination part that emits light along an optical axis of the camera, the cutting method comprising:

a half-cut groove forming step of forming a half-cut groove having a bottom that reflects the light of the epi-illumination part in a range of the peripheral surplus region of the planned dividing line;

a detection step of photographing the half-cut groove by the photographic unit and detecting the half-cut groove with discrimination from the laser-processed groove that diffusely reflects the light of the epi-illumination part and is darkly displayed;
a correction step of correcting deviation between the laser-processed groove and the half-cut groove; and
a cutting step of positioning the cutting blade at a center of the laser-processed groove and carrying out cutting.

2. The cutting method of a workpiece according to claim 1, wherein
the detection step includes a laser-processed groove detection sub-step of detecting the laser-processed groove darkly displayed with discrimination from the surface of the workpiece that reflects the light of the epi-illumination part and is brightly displayed and is on both sides of the laser-processed groove.

* * * * *